United States Patent [19]

Barbiaux et al.

[11] Patent Number: 4,680,541
[45] Date of Patent: Jul. 14, 1987

[54] METER DRIVE INHIBIT CIRCUIT

[75] Inventors: William J. Barbiaux, Schaumburg; Eugene L. Wineinger, Carol Stream, both of Ill.

[73] Assignee: Motorola, Inc., Schaumburg, Ill.

[21] Appl. No.: 924,101

[22] Filed: Nov. 3, 1986

Related U.S. Application Data

[63] Continuation of Ser. No. 629,142, Jul. 9, 1984, abandoned.

[51] Int. Cl.[4] .................. G01R 1/20; G01R 19/00
[52] U.S. Cl. .................. 324/128; 324/76 R; 324/174
[58] Field of Search ............ 324/128, 76 R, 99 R, 324/99 D, 174, 157, 125; 328/132

[56] References Cited

U.S. PATENT DOCUMENTS

| | | | |
|---|---|---|---|
| 2,754,479 | 7/1956 | Swannell | 324/174 |
| 4,008,405 | 2/1977 | Neumann et al. | 328/132 |
| 4,158,809 | 6/1979 | Dellamano | 328/132 |

FOREIGN PATENT DOCUMENTS 580555  9/1946  United Kingdom ............... 324/174

Primary Examiner—Ernest F. Karlsen
Attorney, Agent, or Firm—Steven G. Parmelee

[57] ABSTRACT

A meter drive inhibit circuit is provided whereby an erroneous jump of the meter pointer upon system power-up or subsequent microcomputer reset operation is inhibited. A pulse generator is utilized to produce output pulses relating to the rate of rotation of a drive shaft in a typical tachometer application. Such output pulses are provided to a meter drive circuit which in turn provides an output to an electromechanical meter. Such electromechanical meter will display an output related to the time average value of pulses input to the meter drive circuit. An inhibit circuit stage is connected to the meter drive. A microcomputer is utilized to sense the power-up condition of the meter circuit and activate the inhibit stage. When activated, the inhibit stage will prohibit the meter drive from providing an output to the meter and thereby prevent the erroneous jump of the meter pointer upon system power-up.

1 Claim, 2 Drawing Figures

METER DRIVE INHIBIT CIRCUIT

This is a continuation of application Ser. No. 629,142, filed July 9, 1984 now abandoned.

BACKGROUND OF THE INVENTION

The present invention relates generally to a meter drive circuit and, more particularly, to an inhibit circuit for use in a meter drive circuit.

In an electronic meter such as a tachometer or speedometer, a pulse generator is utilized to provide an output pulse at a frequency related to the rate of rotation of an appropriate shaft in the vehicle in which the meter is mounted. Such a pulse generator usually comprises a general purpose integrated circuit which receives a triggering pulse from a sensor circuit associated with the rotating shaft. The output from the pulse generator is usually a series of squarewave pulses which are supplied to a meter drive circuit. This meter drive circuit can take many forms, but typically comprises a semiconductor device which in turn is connected to the actual meter. The meter usually comprises an electromechanical meter having a needle movement whose deflection is related to the time average value of the pulse input from the meter drive circuit.

A problem with such electronic meters is that the pulse generator may provide an unwanted output pulse upon turning on or power-up of the device. Such an unwanted pulse would cause the meter needle to jump to an erroneous high value and then fall back to a zero value. This is an undesirable condition, and accordingly, it is an object of the present invention to provide a meter drive inhibit circuit to prevent such erroneous meter pointer movement.

SUMMARY OF THE INVENTION

The present invention provides a meter drive inhibit circuit wherein an erroneous meter movement which would occur upon turning on the current through the meter is eliminated.

In electronic meters such as tachometers and speedometers, a pulse generator is utilized to provide a series of pulses at a frequency related to the rate of rotation of the vehicle drive shaft. Such output pulses are provided to a meter drive circuit to provide an input to an electromechanical meter movement. Such electromechanical meter is usually of a deflecting needle type, the deflection of which depends on the time average value of the input signal to the meter drive circuit. Typically, the pulse generator receives a triggering input from a sensor circuit associated with the drive shaft of the vehicle.

Usually the meter drive circuit comprises a semiconductor device such as a transistor which, when turned on or in a conducting state, will allow the pulse generator output to pass to the meter. The meter drive inhibit circuit of the present invention utilizes circuitry to turn off this meter drive transistor to inhibit any pulse from the pulse generator from producing any meter movement.

To insure that the inhibit circuitry is operating at the power-up stage, and then turns off to permit meter operation after any chance of an erroneous pulse has ended, a computer usually comprising a microprocessor is utilized. An output from this microprocessor is tied to the base of a semiconductor device such as a transistor, usually called the inhibit transistor. At a power-up stage of operation of the meter circuit, the microprocessor output goes to a high impedance state during this reset condition. This causes the inhibit transistor to be turned on to a conducting state which thereby provides a path for the pulse generator output away from the meter driving transistor. The microprocessor is internally programmed to remain in such logic one high impedance condition for a preselected time long enough to insure that no incorrect pulse is transmitted to the meter. The microprocessor output will, after such delay, be set to a low state to turn the inhibit transistor off. This will permit the output from the pulse generator to turn on the meter drive transistor which in turn permits normal deflection and operation of the meter.

In particular, the present invention provides a meter drive inhibit circuit comprising a pulse generator having an output, a meter drive section connected to said pulse generator output and itself having an output, a meter connected to said meter drive output, a computer having an output and an inhibit stage connected to said computer output and having an output connected to said meter drive section, said computer capable of providing an output signal to said inhibit stage whereby said inhibit stage inhibits said meter drive section from receiving said pulse generator output.

DESCRIPTION OF THE PREFERRED EMBODIMENT

Figure 1:
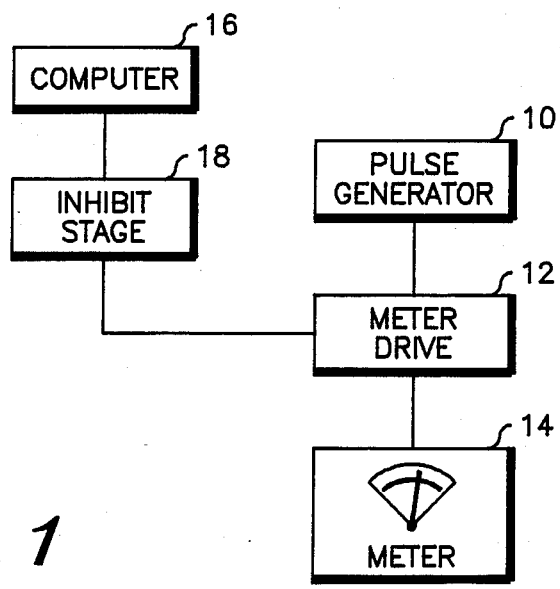
FIG. 1 is a block diagram of the meter inhibit circuit of the present invention.

Referring now to FIG. 1, a block diagram of the meter drive inhibit circuit of the present invention is shown. Pulse generator 10 provides an output connected to meter drive circuit 12. Meter drive circuit provides an output to meter 14, usually comprising an electromechanical deflecting needle type meter, although electrical analogs of such meters would be operable in this circuit. Computer 16 usually comprises a microprocessor and is connected to inhibit stage 18. Upon receiving the appropriate output from computer 16, inhibit stage 18 will provide an output to meter drive 12 thereby prohibiting any output from meter drive 12 to meter 14. Typically, such inhibit is provided under a turning on or power-up condition of the circuit. After a preselected delay, computer 16 will change the output to inhibit stage 18 and accordingly an appropriate output will be provided to permit meter drive 12 to operate meter 14 under normal conditions.

Figure 2:
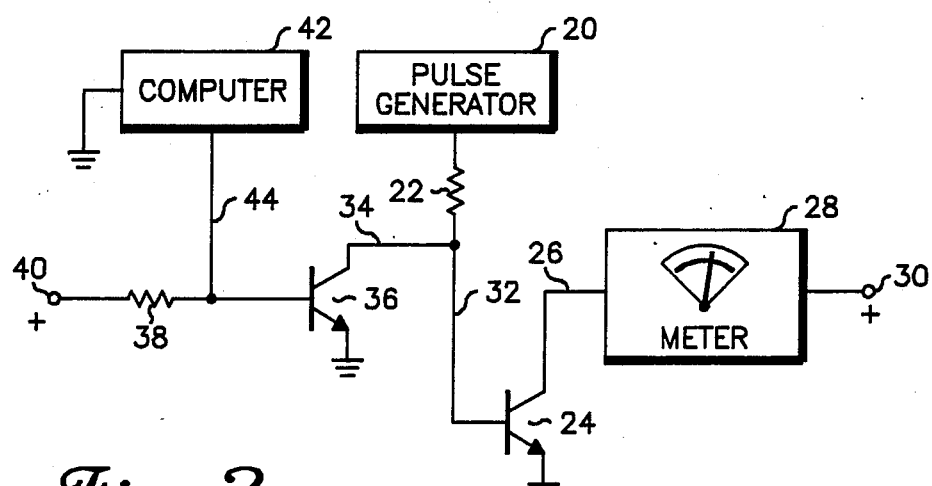
FIG. 2 is a diagram of the meter inhibit circuit of the present invention.

Referring now to FIG. 2, a more detailed drawing of the present invention is shown. Pulse generator 20 is connected through resistor 22 and lead 32 to the base of drive transistor 24. The collector of drive transistor 24 is connected through lead 26 to meter 28. Another terminal of meter 28 is connected to a positive voltage source 30. Computer or microprocessor 42 is also provided which is connected via lead 44 to the base of inhibit transistor 36. A positive voltage source 40 is also connected to the base of inhibit transistor 36 through resistor 38. The collector of inhibit transistor 36 is connected via lead 34 to lead 32, which is connected to the base of drive transistor 24.

In normal operation, when the pulse generator would be providing an output to enable meter 28 to operate as a tachometer or a speedometer, output 44 of computer 42 would be a logic zero low impedance output thereby allowing voltage source 40 to, in effect, be grounded through resistor 38 and computer 42. Accordingly, the base of inhibit transistor 36 would not receive drive current and would be in an off or nonconducting condition. Outputs from pulse generator 20 would travel through resistor 22 and lead 32 to the base of drive transistor 24. This would permit the intermittent turning on of drive transistor 24 and permit voltage source 30 to supply meter 28 with appropriate current to reflect correct meter operation as controlled by pulse generator 20 output.

There are four conditions that are desired for the computer 42 to operate in a reset condition and thereby inhibit the meter operation. These conditions are an initial instrument power-up to eliminate erroneous meter needle jumps, low voltage supply to the computer and to pulse generator 20 and malfunction of the computer under an internal or external reset condition. Whenever computer 42 is in such a reset condition, its output terminal would be in a high impedance condition. Accordingly, voltage source 40 would supply a drive current through resistor 38 to transistor 36, thereby turning transistor 36 on or to a conducting condition. If such transistor 36 were in a conducting condition, output pulses from pulse generator 20 would travel through resistor 22 and lead 34 to ground through transistor 36. Accordingly, drive transistor 24 would not be turned on and thereby meter 28 would remain undeflected. After a preselected delay, computer 42 would change to a logic zero low impedance output and normal meter operation would occur.

What is claimed is:

1. A meter drive circuit for use with a vehicle having a drive shaft that rotates, the meter drive circuit comprising:

pulse generator means for providing a pulse output at a frequency related to rotation of said drive shaft;

meter drive means for receiving said pulse output and for providing a meter drive signal in response thereto, said meter drive means including a first transistor that can be biased on and off by said pulse generator means to thereby provide said meter drive signal;

a meter device having a deflecting needle, the deflection of which depends on said meter drive signal;

inhibit means responsive to initially powering up said meter drive circuit for inhibiting said first transistor from providing said meter drive signal to said meter device for a predetermined time period upon initial application of power to said meter drive circuit, wherein said inhibit means includes a second transistor that can be switched into:

a first conductive state to that causes said first transistor to switch off; and a second conductive state that allows said first transistor to respond to said pulse generator means.

* * * * *